United States Patent [19]

Scifres et al.

[11] Patent Number: 5,033,054
[45] Date of Patent: Jul. 16, 1991

[54] PHASE CONJUGATE LASER

[75] Inventors: Donald R. Scifres, San Jose; Richard R. Craig; Robert G. Waarts, both of Palo Alto, all of Calif.

[73] Assignee: Spectra Diode Laboratories, Inc., San Jose, Calif.

[21] Appl. No.: 568,942

[22] Filed: Aug. 17, 1990

[51] Int. Cl.$^5$ .............................................. H01S 3/05
[52] U.S. Cl. ........................................ 372/50; 372/19; 372/92; 372/96; 372/99
[58] Field of Search .................... 372/29, 18, 19, 45, 372/46, 50, 92, 99, 96, 98, 32

[56] References Cited

U.S. PATENT DOCUMENTS

| 4,233,571 | 11/1980 | Wang et al. | 331/94.5 C |
| 4,633,476 | 12/1986 | Scifres et al. | 372/45 |
| 4,972,427 | 11/1990 | Streiffer et al. | 372/50 |

OTHER PUBLICATIONS

C. H. Chang-Hasnain et al., "High Power with High Efficiency in a Narrow Single-Lobed Beam from a Diode Laser Array in an External Cavity", *Applied Physics Letters* 50 (21), May 25, 1987, pp. 1465–1467.
J. R. Leger et al., "Coherent Addition of AlGaAs Lasers Using Microlenses and Diffractive Coupling", *Applied Physics Letters* 52 (21), May 23, 1988, pp. 1771–1773.
C. Chang-Hasnain et al., "Diffraction-Limited Emission from a Diode Laser Array in an Apertured Graded-Index Lens External Cavity", *Applied Physics Letters* 49 (11), Sep. 15, 1986, pp. 614–616.
M. Taneya et al., "Diffraction-Limited Single Beam Emitted from an Array Diode with a Phase Shifter", and J. Berger et al., Narrow Far-Field Beam from a Y-Junction Laser Array Using a Customized Spatial Filter in an External Cavity, both in *Conference on Lasers and Electro-Optics*, Apr. 26–May 1987, p. 316.
A. Golubentsev, "Theory of Phase Locking of an Array of Lasers", *Sov. Phys. JETP* 66 (4), Oct. 1987, pp. 676–682.
J. Winthrop et al., "Theory of Fresnel Images. I. Plane Periodic Objects in Monochromatic Light", *J. Optical Society of America*, vol. 55, No. 4, Apr. 1965, pp. 373–381.
V. Shkunov et al., "Optical Phase Conjugation", *Scientific American*, Dec. 1985, pp. 54–59, 150.
D. Pepper, "Applications of Optical Phase Conjugation", *Scientific American*, Jan. 1986, pp. 74–83, 126, see especially pp. 77–78.

*Primary Examiner*—James W. Davie
*Attorney, Agent, or Firm*—Schneck & McHugh

[57] ABSTRACT

A laser having a phase conjugating reflector positioned with a resonant cavity of a laser configuration capable of multimode operation. The resonant cavity or other means associated with the laser configuration selects the preferred mode at threshold. The phase conjugating material builds up reflectivity as the light intensity is increased above threshold power levels to maintain the selected mode to high power levels. One embodiment has an external Talbot cavity with a first mirror in a Talbot plane of a multi-emitter laser array and with the phase conjugating material at a sub-Talbot plane. Another embodiment has an external GRIN lens cavity with a far field apertured stripe mirror for threshold mode selection. The phase conjugator is placed at a high light intensity position within the cavity such as adjacent to the stripe mirror or adjacent to the laser array. The laser source may be a linear laser diode array or a 2-D surface emitting laser array. An additional embodiment uses a diode-array-pumped solid state laser medium together with a phase conjugator between the cavity mirrors.

26 Claims, 4 Drawing Sheets

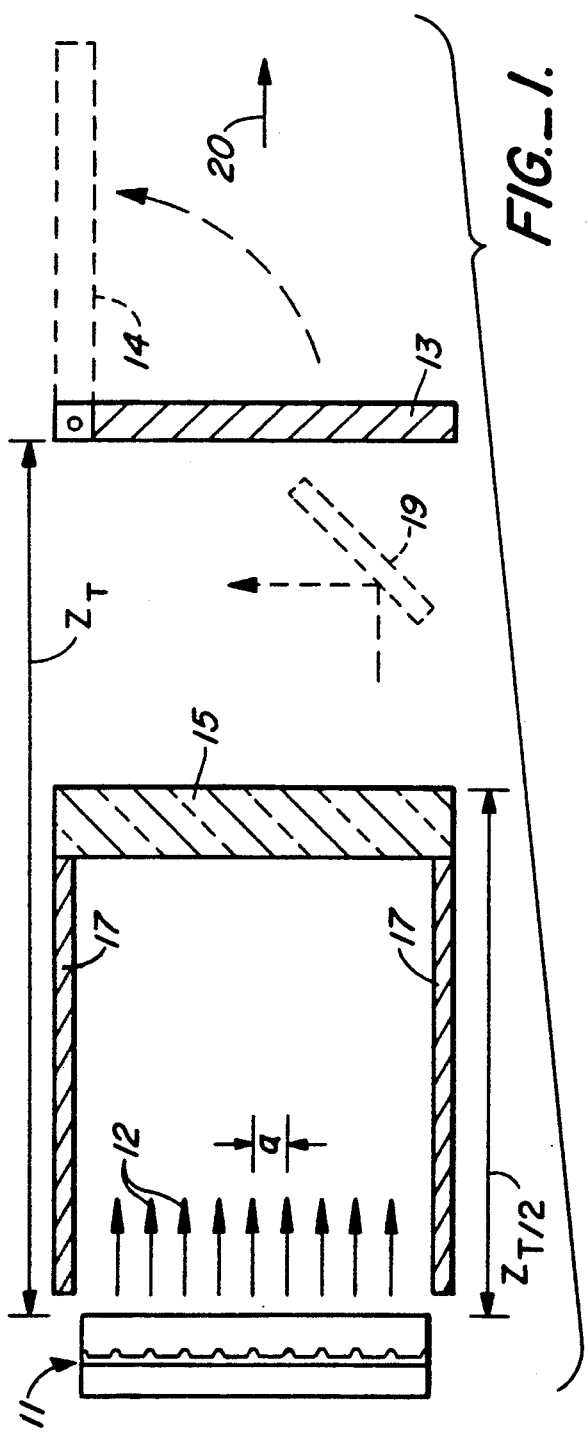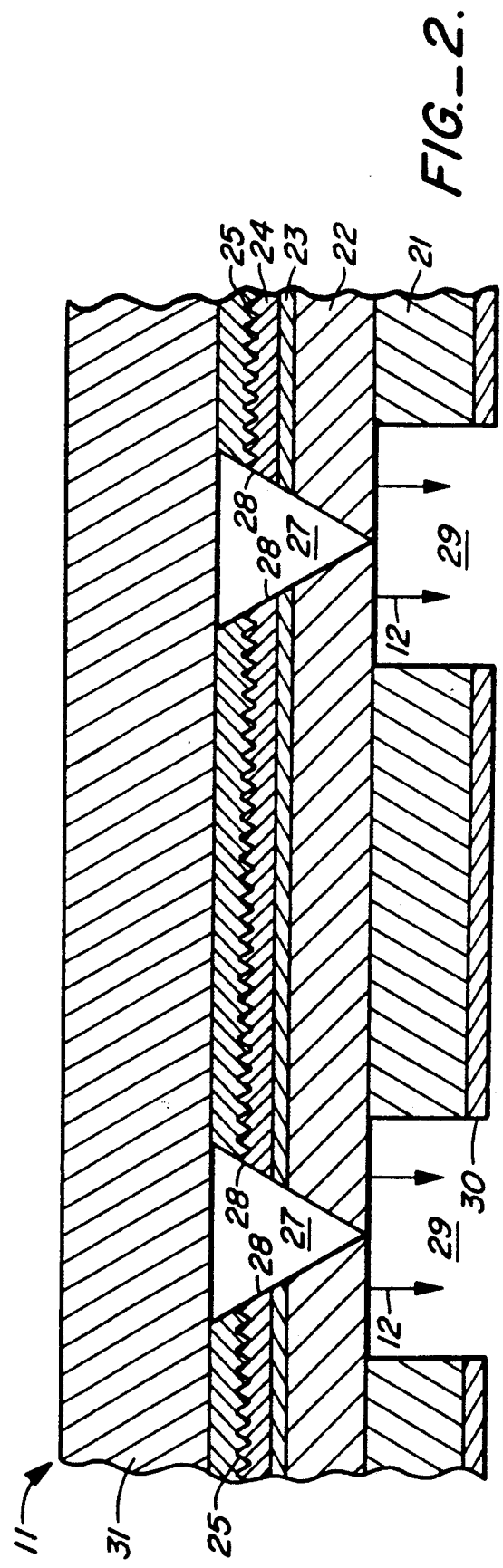

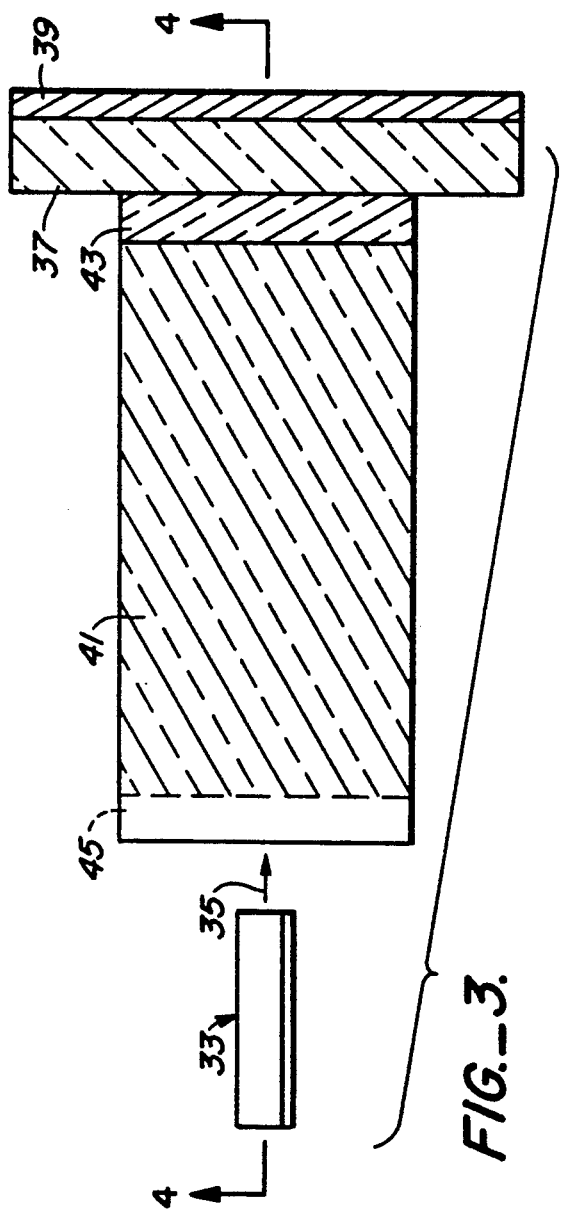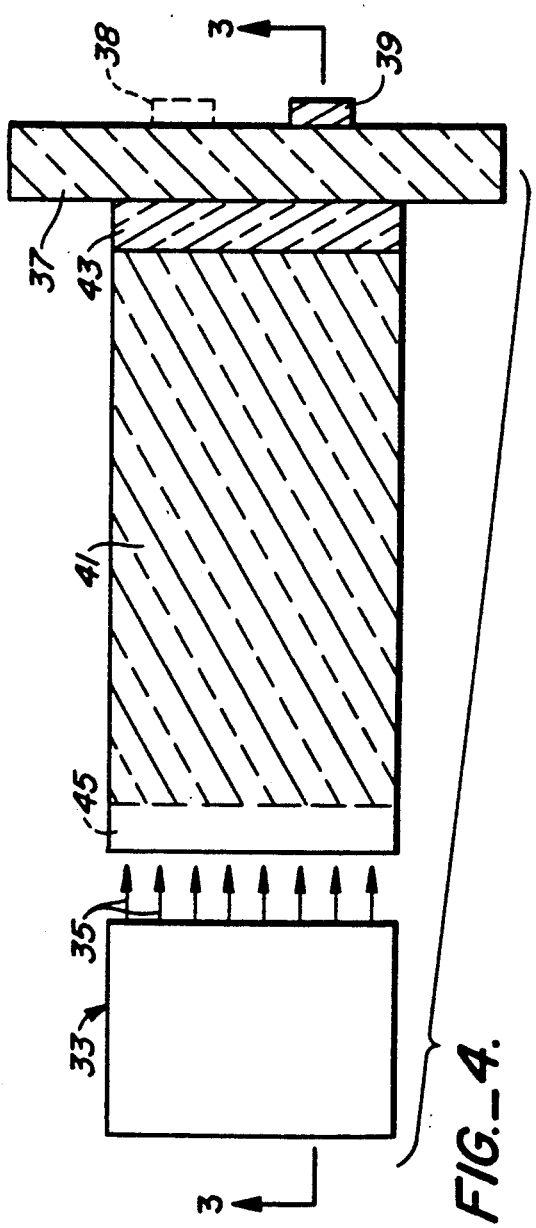

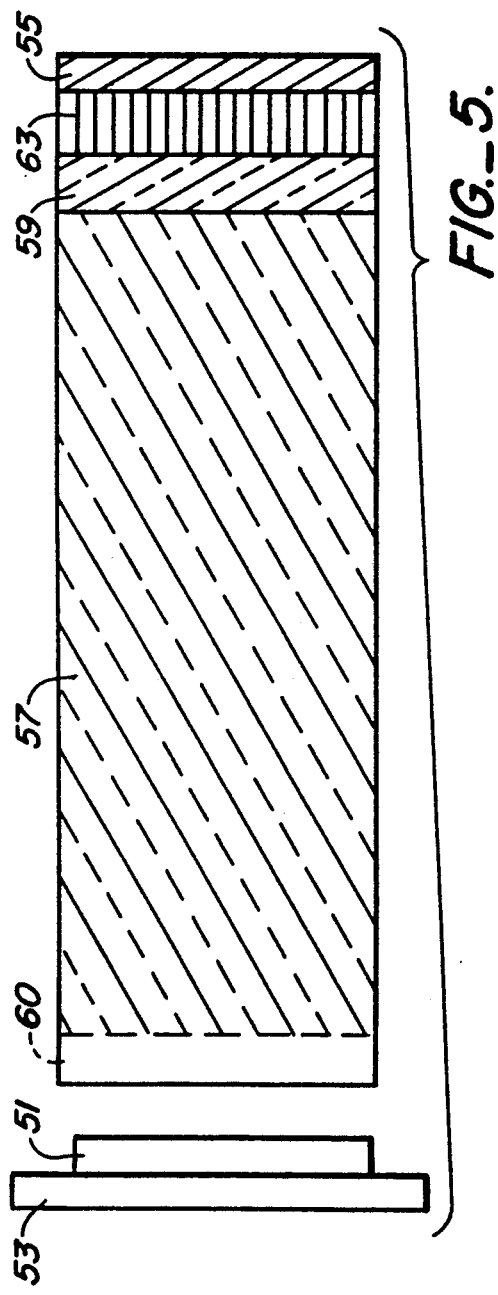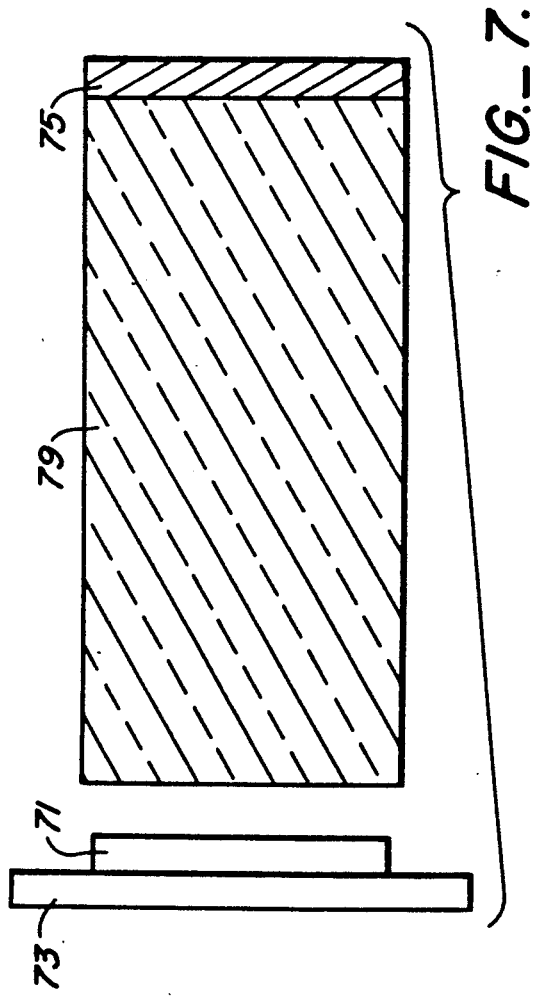

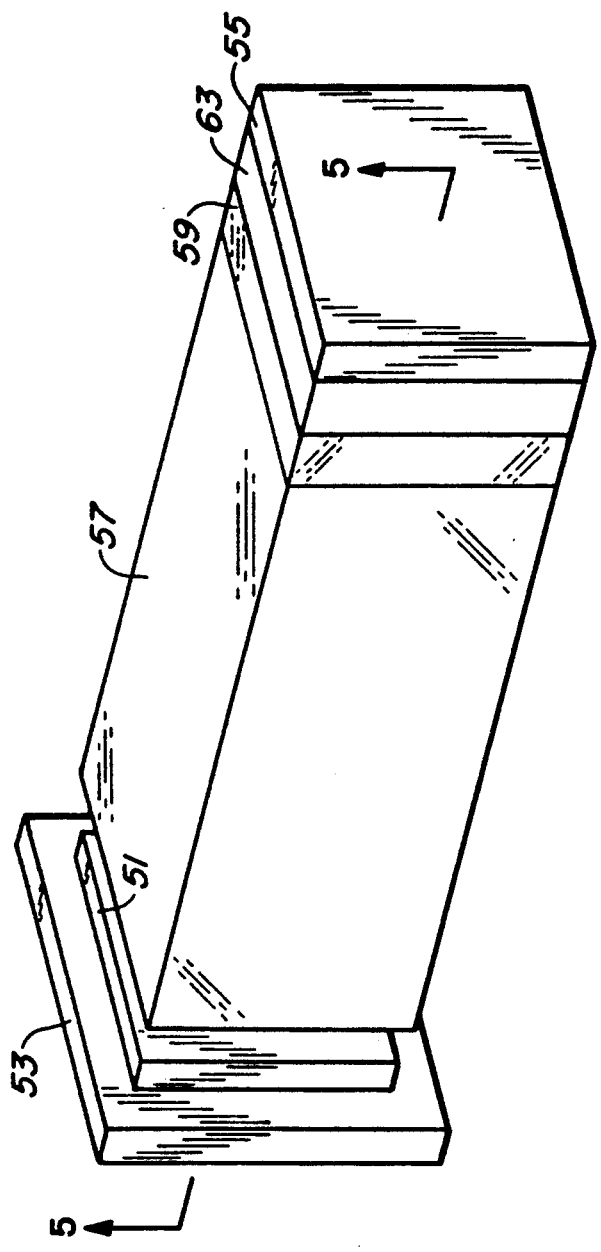
FIG._6.
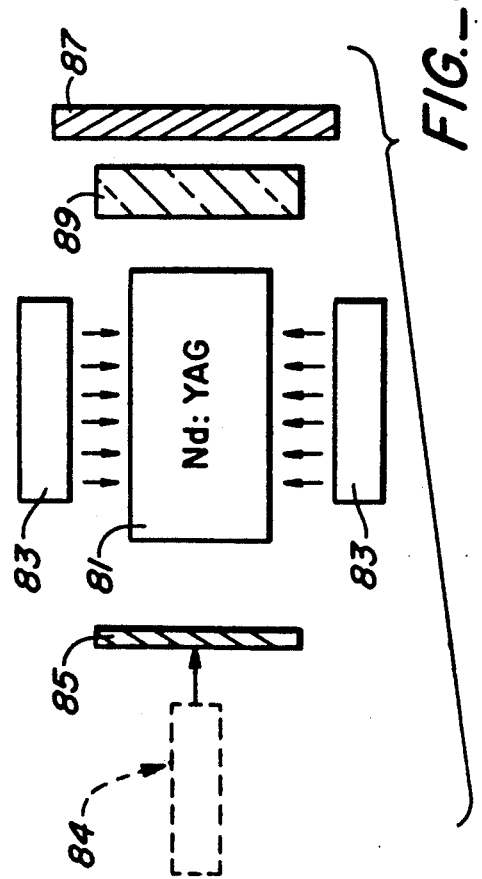
FIG._8.

PHASE CONJUGATE LASER

DESCRIPTION

1. Technical Field

The present invention relates to lasers with particular resonant cavities for stabilizing the laser output, and in particular to semiconductor diode laser arrays with external cavities.

2. Background Art

A number of lasers have been constructed in an attempt to combine efficient high power operation with a single mode diffraction-limited beam output. Relatively high power is achieved with multiple element diode lasers, such as linear laser arrays or "laser bars" and 2-D surface emitting laser arrays. Mode selection can be achieved with a number of cavity designs.

In U.S. Pat. No. 4,633,476, Scifres et al. describes a semiconductor laser which emits light beams through openings in a substrate surface in a direction transverse to the plane of an active layer or layers. The laser has angled reflectors in the form of grooves to deflect light propagating along the active layer out of the plane of the active layer and out of the laser by means of total internal reflection. Various constructions are described for providing feedback, including a periodic grating, a dielectric stack reflector and microcleaved vertical facets through the active layer. The angled reflectors permit multiple laser emitters to be formed in a 2-D surface array configuration.

C. J. Chang-Hasnain et al., in *Applied Physics Letters* 50 (21), May 25, 1987, pp. 1465–1467, describe a laser configuration which includes a diode laser array having a high reflectivity coated back facet and an antireflection coated front facet, a quarter pitch graded-index (GRIN) lens butt coupled at one end to the front facet of the laser array, and an apertured stripe mirror consisting of a single thin gold stripe fabricated on a sapphire substrate placed at the other end of the GRIN lens. In operation, the GRIN lens images the near field of the diode laser array to a far field distribution at the position of the stripe mirror. The laser array prefers to operate in a high order supermode with a two-lobed optical beam in the far field. The thin stripe of the mirror is placed off center so that one lobe of the far field beam is fed back to the array. The high order mode is thereby enhanced and stabilized. In effect, the mirror acts as a spatial filter which selects the modes of the total cavity, thereby obtaining a coherent output. The output is taken from the other lobe, which is already collimated by the GRIN lens.

J. R. Leger et al., in *Applied Physics Letters* 52, (21), May 23, 1988, pp. 1771–1773, describe a coherent diode laser array which employs a monolithic integrated linear array of semiconductor laser emitters or "laser bar" in an external Talbot cavity. A diffractive microlens array is placed in front of the array to collimate the individual emitted beams where they just start to overlap in order to provide a filled aperture. Talbot cavities rely on the phenomenon that an infinite one-dimensional array of identical optical emitters with center-to-center spacing "a" reimages itself at a distance $Z_T = 2a^2/\lambda$ or any integer multiple thereof, where $\lambda$ is the wavelength of the emitted light. Placing a feedback mirror or reflector at one-half the Talbot distance, $Z_T/2$, or integer multiples thereof, causes an array of laser emitters to reimage back upon themselves and be coupled back into the laser waveguides. Thus, the configuration can serve as the basis for a laser cavity. The power from each emitter couples into its neighbors by diffraction during the propagation and reflection process, so the array locks coherently. In-phase emitters also reimage at a distance $Z_T/2$, that is at the position of the reflector, but laterally shifted by a/2. Thus, a partial reflector at $Z_T/2$ can function as the laser's output element.

The laser structures described above, as well as many others, generally are capable of stable single diffraction-limited mode operation at or near threshold power levels. However, as the power level is increased, each of the lasers will eventually lose the high degree of coherence which was obtained at threshold, because of nonlinear distortions, gain saturation, thermal changes, failures and nonuniformities of emitting elements and the like. Modal discrimination above threshold is reduced and the selected mode of operation tends to become unstable. Thus, the maximum output power for which a desired single spatial mode can be reliably maintained is limited by these factors.

In U.S. Pat. No. 4,233,571 Wang et al. describe a laser which includes a partially transmissive first reflector, an aperture stop, an excited lasing medium and a nonlinear phase conjugate second reflector. The aperture stop restricts laser operation to the fundamental mode by allowing only unaberrated waves to pass through and exit the laser. The phase conjugate reflector reflects the phase conjugate waveform of aberrated wavefront impinging thereupon back through the lasing medium, thereby correcting their wavefronts.

It is an object of the present invention to provide a laser that maintains single mode operation for power levels that are far above threshold.

DISCLOSURE OF THE INVENTION

The above object has been met with a laser having a phase conjugating reflector positioned within a resonant cavity of a laser configuration. Though the laser configuration by itself is capable of multimode operation, the resonant cavity or other means associated with the laser configuration is capable of selecting a single preferred mode of operation at the lasing threshold. The phase conjugating reflector then stabilizes the selected mode above threshold, so that the desired mode is maintained at power levels much higher than previously possible. The phase conjugating reflector responds to changes in the light incident upon it, adjusting to small phase perturbations developing in the resonant cavity, to maintain the established mode. The phase conjugating reflector, placed inside the resonant cavity, may be positioned in a high light intensity plane for a faster dynamic response.

Typically, the laser configuration is a multiple element laser diode, such as a laser bar or a 2-D surface emitting laser array, in an external cavity. The external cavity may be a Talbot cavity with a principal mirror located in a Talbot plane a distance $Z_T = na^2/\lambda$ from a phase plane of the laser diode, where "n" is an integer, "a" is the periodicity of the emitting elements of the laser diode and "$\lambda$" is the wavelength of emitted light. In this embodiment, high light intensity locations within the Talbot cavity where a phase conjugating optical material could be placed would correspond to sub-Talbot planes, such as the plane located a distance $Z_T/2$ from the phase plane of the laser diode. The Talbot cavity may include edge reflectors to simulate an "infinite" Talbot cavity.

Other external resonant cavities may include a waveguide, such as a graded-index lens or total internal reflection slab waveguide, placed in front of laser diode array. The phase conjugator may then be a nonlinear optical plate placed at either end of the waveguide. Alternatively, the waveguide itself may be a slab of phase conjugating nonlinear optical material. Cavity mode selection at threshold may include selective reflectors, such as an apertured stripe mirror placed in the Talbot plane or in the far field at the end of the waveguide, or may include phase adjustors, such as a liquid crystal array, placed in the external cavity. In each case, once a mode is established at threshold, the phase conjugator maintains that mode dynamically at higher power levels. The threshold mode selector may in fact be removed once the phase conjugate reflection takes over.

BRIEF DESCRIPTION OF THE DRAWINGS

FIG. 1 is a side sectional view of a first laser embodiment in accord with the present invention.

FIG. 2 is a detailed side sectional view of a surface emitting laser diode array for use in the embodiment of FIG. 1.

FIG. 3 is a side sectional view of a second laser embodiment in accord with the present invention.

FIG. 4 is a top sectional view taken along the line 4—4 in FIG. 3.

FIG. 5 is a side sectional view of a third laser embodiment in accord with the present invention.

FIG. 6 is a perspective view of the embodiment in FIG. 5.

FIG. 7 is a side sectional view of a fourth laser embodiment in accord with the present invention.

FIG. 8 is a side sectional view of a fifth laser embodiment in accord with the present invention.

BEST MODE FOR CARRYING OUT THE INVENTION

With reference to FIG. 1, a laser in accord with the present invention includes a multiple element periodic laser diode array 11 emitting multiple beams 12. The laser also includes a first mirror 13 placed at a Talbot plane relative to the laser array 11. In other words, first mirror 13 is spaced a distance $Z_T$ from a phase plane of laser array 11, where $Z_T = a^2/\lambda$, where a is the spacing between emitted beams 12 and $\lambda$ is the wavelength of emitted beams 12. First mirror 13 may also be placed at any distance which an integral multiple or divisor of $Z_T$. The laser also includes a phase conjugating material 15 positioned between laser array 11 and first mirror 13. A typical phase conjugating material is barium titanate $BaTiO_3$, but other phase conjugating materials, such as GaAs, GaP as well as others, are known and may also be used. Phase conjugating material 15 may be placed at a high light intensity plane relative to the laser array 11, such as a Talbot plane or a sub-Talbot plane. For example, the phase conjugating material 15 may be a plate in a position at distance $Z_T/2$ from the laser array face plane. Such a positioning may increase the dynamic response of the phase conjugating material but is not a requirement for conjugation. The laser may include edge reflectors 17 aligned parallel to the propagation direction of beams 12 and positioned to the sides and, for 2-D arrays, the top and bottom of laser array 11. Edge reflectors 17 extend at least as far as phase conjugating material 15 and may extend as far as first mirror 13. Edge reflectors 17 simulate an infinite laser array 11 so as to provide uniform light intensity in each gain element of the laser array 11.

The multiple element laser diode array 11 may be a two dimensional surface emitting laser array. Such an array is described in U.S. Pat. No. 4,633,476. Briefly, a surface emitting laser includes a semiconductor substrate 21 with a plurality of semiconductor layers 22–24 disposed on substrate 21. At least one of the layers 23 is an active gain layer. Layers 22 and 24 bounding active layers 23 form a waveguide for the propagation of light along the active region 23. In the embodiment shown in FIG. 2, a periodic grating 25 is defined on waveguide layer 24 for distributed feedback. A plurality of grooves 27 are formed through the semiconductor layers 22–24. Grooves 27 define angled reflectors 28 which are the sides of groove 27. Light propagating along active region 23 is deflected by angled mirrors 28 to a direction perpendicular to the plane of active region 23. Openings 29 are defined in substrate 21 at locations along groove 27 to permit the light deflected from active region 23 to be admitted. The light passing through holes 29 form the output beams 12 in FIG. 1. Conductive coating 30 applied to the substrate 21 and a conductive heat sink 31 disposed on the laser surface on the opposite side of active region 23 form electrodes for electrically pumping the active region 23. The laser array 11 in FIGS. 1 and 2 may be a two-dimensional array as just described or alternatively may be a linear array known in the art.

The Talbot cavity laser in FIG. 1 has a high degree of mode discrimination at threshold. Accordingly, first mirror 13 initiates laser operation and insures that a diffraction-limited cavity mode will lase. Once oscillation begins the phase conjugating material 15 builds up its reflectivity, and forms a reflective grating at the Talbot or sub-Talbot plane. This new phase conjugate mirror would now have the property of being dynamic with respect to small perturbations in the laser array 11 and thus would respond or adjust to maintain the starting cavity mode. Thus the phase conjugating material 15 produces a high mode discrimination above threshold, since, as the power increases, the phase conjugating mirror grows stronger to provide the correct feedback. For best mode discrimination, first mirror 13 generally has a high reflectivity. Accordingly, an optional deflection mirror 19 may be used to extract the laser beam. Alternatively, a lower reflectivity for first mirror 13 may be used and the beam may be extracted through the now partially transmissive mirror 13. Alternatively, once the phase conjugate mirror 15 builds up its reflectivity, the first mirror 13 is no longer needed to select the cavity mode. Thus, once the phase conjugated reflector is strong enough the mirror 13 may be removed, as for example by pivoting out of the way of the emitted beam 20 to a position designated by the phantom mirror 14 in FIG. 1.

With reference to FIG. 3, another laser of the present invention includes a multi-element laser diode array 33, such as a monolithic integrated linear laser array or "laser bar", emitting a multitude of beams 35. Linear array 33 is capable of operating in a plurality of cavity modes. The laser in FIGS. 3 and 4 also includes an apertured stripe mirror made up of a transparent mirror substrate 37 and one or more reflective stripes 38 and 39 formed on substrate 37. Typically, the apertured stripe mirror is placed in the far field of a laser array 33 that operates at threshold in a mode with a two lobe far field beam. A highly reflective stripe 39 is placed in the position of one of the lobes. Another lower reflectivity stripe 38 may be placed at the position of the other lobe and provide the output gain of the laser. Stripe 38 is optional but does lower the threshold of lasing operation. A graded index (GRIN) lens waveguide 41 is inserted into the cavity between laser array 33 and aperture stripe mirror 37. Phase conjugating material 43 is also placed in the external cavity between the laser array 33 and the aperture stripe mirror substrate 37 and the high intensity light position. Two such positions are immediately adjacent to the apertured stripe mirror substrate 37 and immediately adjacent to the laser array 33. Accordingly, the phase conjugating material 43 will be placed at an end of the GRIN lens waveguide 41. Alternatively, the phase conjugating material may be placed at a beginning lens waveguide as indicated by the plate 45 in FIGS. 3 and 4.

In operation, the combination of the laser array 33 and the apertured stripe mirror 37-39 selects the preferred cavity mode at laser threshold. At or below threshold the phase conjugating material 43 is inactive. As the light intensity builds up in the cavity the phase conjugating material 43 begins to act as a mirror. The phase conjugating material reacts dynamically to changes in the phase of the incident light so as to maintain the preferred mode of oscillation at high power levels. In the absence of a phase conjugating crystal, nonlinear distortions, gain saturation thermal changes, etc., would cause the laser to lose its high degree of coherence which it obtained at threshold. Accordingly, higher output powers can be maintained in the desired mode of oscillation when phase conjugating crystal 43 is inserted into the laser cavity.

With reference to FIGS. 5 and 6, another laser embodiment includes a two-dimensional surface emitting laser array 51 on a heat sink 53 and a reflector 55 spaced some distance away from the emitting surface of laser array 51. Laser array 51 and reflector 55 form a laser cavity in which a waveguide 57 is disposed. Waveguide 57 may be a total internal reflection slab of fused silica for simulating an infinite laser array 51. Phase conjugating material 59 is disposed on an end of waveguide 57 in a high light intensity plane. Such a plane might be a Talbot or sub-Talbot cavity plane. Alternatively, phase conjugating material might be placed immediately in front of laser array 51 at the beginning of slab 57 as indicated by optional phase conjugating material 60. The laser resonant cavity includes a liquid crystal array 63 for selecting a preferred cavity mode at threshold. Liquid crystal array 63 adjusts the phase of each emitter to produce the desired phase relationship between the various light beams produced by the array 51. The liquid crystal array may be controlled by phase sensing optics external to the cavity and not shown here. Liquid crystal array 63 may be placed either adjacent to reflector 55 or immediately in front of the two-dimensional array 51. Once the preferred mode has been established at threshold, the phased conjugating material 59 (or 60) maintains the selected spatial mode well above the threshold.

In FIG. 7 another laser has a multi-element laser array 71 on a heat sink 73 and a mirror 75 in front of the array 71 to establish and external resonant cavity. Phase conjugating material 79 is placed inside the cavity between the laser array 71 and the mirror 75. Mirror 75 is preferably a far field mirror and the phase conjugating material in this embodiment is a slab of nonlinear phase conjugating material. The phase conjugating slab 79 will develop rapid response phase conjugating reflectors at high intensity regions in the crystal slab. These high intensity regions will be at Talbot planes of the external cavity. Thus, once a desired mode is selected at threshold the phase conjugating material will maintain the desired mode at power levels far exceeding that previously achieved. At the present time, such nonlinear crystals are not widely available or inexpensive in such large dimensions of an entire waveguide. Accordingly, at the present time the embodiment shown previously using this phase conjugating plates placed at the Talbot positions or other high intensity positions are preferred.

With reference to FIG. 8, the use of phase conjugating reflectors inside the resonant laser cavity is not necessarily limited to use with semiconductor diode arrays. Rather, phase conjugating reflectors may be used in other laser media capable of multimode operation which mode can be selected at threshold. The phase conjugating reflectors would then maintain the selected mode at higher power levels. For example, a laser pumped neodymium YAG (Nd:YAG) media 81 is positioned between reflectors 85 and 87 forming a resonant laser cavity. For high power output the Nd:YAG material 81 is often pumped optically from the sides by light sources 83, such as laser bars. A number of different means may be used to establish a preferred mode at threshold. For example, a single end pumping laser diode 84 may direct a light beam into the Nd:YAG material 81 to establish low power operation in the $TEM_{0,0}$ mode. In the example a phase conjugating reflector 89 is positioned between the Nd:YAG material 81 and the reflector 87. Once the preferred lasing mode is established by the end pumping laser source 84, the phase conjugating material 89 builds up a reflectivity corresponding to that mode. Subsequent pumping from the sides by laser diodes 83 will then no longer affect the output mode because phase conjugating material will compensate as the power level increases. This construction may use other materials than Nd:YAG material 81.

We claim:
1. A laser comprising
   a multiple element laser diode in an external resonant cavity, said laser diode capable of multimode operation,
   means for selecting a single mode of operation within said cavity, and
   a phase conjugating reflector positioned within said resonant cavity, whereby said phase conjugating reflector stabilizes said selected mode of operation above a threshold of laser operation.
2. The laser of claim 1 wherein said external cavity is a Talbot cavity, said phase conjugating reflector being positioned at a sub-Talbot plane in said cavity.
3. The laser of claim 2 wherein said Talbot cavity includes edge reflectors.
4. The laser of claim 1 wherein said external cavity includes a graded-index lens waveguide positioned in front of said laser diode.
5. The laser of claim 1 further comprising a liquid crystal array in said resonant cavity providing a selective phase adjustment for each emitter of said multiple element laser diode.
6. A laser comprising
   a laser configuration capable of multimode operation,
   an apertured mirror at one end of a resonant cavity of said laser configuration providing selective feed- back of light in a single selected mode of operation, and a phase conjugating reflector positioned within said resonant cavity of said laser configuration, whereby phase conjugating reflector stabilizes said selected mode of operation above a threshold of laser operation.

7. A laser comprising
a laser configuration capable of multimode operation,
means associated with said laser configuration for selecting a single mode of operation, and
a phase conjugating reflector positioned within a resonant cavity of said laser configuration, whereby said phase conjugating reflector stabilizes said selected mode of operation above a threshold of laser operation,
wherein said selecting means is removable from association with said laser configuration when said phase conjugating reflector is fully activated.

8. A laser comprising,
a multiple element laser diode,
an external resonant cavity capable of selecting a preferred cavity mode at threshold, and
phase conjugate means in said cavity for stabilizing said preferred cavity mode above threshold.

9. The laser of claim 8 wherein said laser diode is a surface emitting, two-dimensional laser array.

10. The laser of claim 8 wherein said laser diode is a monolithic integrated linear laser array.

11. The laser of claim 8 wherein said external resonant cavity has a mirror located in a plane a Talbot distance $Z_T = na^2/\lambda$ from a phase plane of said laser diode, where n is an integer, a is a periodic spacing between emitting elements of said laser diode and $\lambda$ is a wavelength of emitted light.

12. The laser of claim 11 wherein said external resonant cavity includes edge reflectors between said mirror and said laser diode.

13. The laser of claim 11 wherein said phase conjugate means comprises nonlinear optical material located at least at a distance $Z_T/k$, where k is an integer.

14. The laser of claim 8 wherein said external resonant cavity has a mirror located in a plane a sub-Talbot distance $Z_T = a^2/n\lambda$ from a phase plane of said laser diode, where n is an integer, a is a periodic spacing between emitting elements of said laser diode and $\lambda$ is a wavelength of emitted light.

15. The laser of claim 14 wherein said external resonant cavity includes edge reflectors between said mirror and said laser diode.

16. The laser of claim 14 wherein said phase conjugate means comprises nonlinear optical material located at least at a distance $Z_T/k$, where k is an integer.

17. The laser of claim 8 wherein said external resonant cavity includes a waveguide in front of said laser diode.

18. The laser of claim 17 wherein said waveguide is a graded-index lens.

19. The laser of claim 17 wherein said phase conjugate means comprises a nonlinear optical plate at either end of said waveguide.

20. The laser of claim 17 wherein said phase conjugate means comprises said waveguide, said waveguide being a slab of nonlinear optical material.

21. The laser of claim 8 wherein said external resonant cavity includes a cavity mode selecting apertured stripe mirror defining one end of said cavity.

22. The laser of claim 8 wherein said external resonant cavity includes a phase adjusting liquid crystal array therein.

23. A laser comprising
a laser configuration capable of multimode operation,
means associated with said laser configuration for selecting a single specified longitudinal mode of operation, and
a phase conjugating resonator positioned within a resonant cavity of said laser configuration, whereby said phase conjugating resonator stabilizes said specified longitudinal mode of operation above a threshold of laser operation.

24. The laser of claim 23 wherein said means for selecting a single specified longitudinal mode of operation comprises a periodic grating in said resonant cavity providing feedback of a specified longitudinal mode corresponding to the period of said grating.

25. The laser of claim 23 wherein said laser configuration comprises a surface emitting laser array.

26. The laser of claim 23 further comprising means associated with said laser configuration for selecting a single specified transverse mode of operation, said phase conjugating reflector also stabilizing said specified transverse mode of operation.

* * * * *